(12) United States Patent
Sharma et al.

(10) Patent No.: US 7,054,119 B2
(45) Date of Patent: May 30, 2006

(54) COUPLED FERROMAGNETIC SYSTEMS HAVING MODIFIED INTERFACES

(75) Inventors: Manish Sharma, Sunnyvale, CA (US); Janice H. Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 173 days.

(21) Appl. No.: 10/463,930

(22) Filed: Jun. 18, 2003

(65) Prior Publication Data

US 2004/0257717 A1  Dec. 23, 2004

(51) Int. Cl.
*G11B 5/39* (2006.01)
(52) U.S. Cl. .............................. 360/324.2; 360/324.11
(58) Field of Classification Search ............ 360/324.1, 360/324.11, 324.12, 324.2
See application file for complete search history.

(56) References Cited

U.S. PATENT DOCUMENTS

| 5,465,185 | A |   | 11/1995 | Heim et al. ............. 360/324.11 |
| 5,648,885 | A | * | 7/1997  | Nishioka et al. ........ 360/324.12 |
| 5,657,191 | A | * | 8/1997  | Yuan ........................... 360/324 |
| 6,181,537 | B1 | * | 1/2001 | Gill ......................... 360/324.2 |
| 6,215,631 | B1 | * | 4/2001 | Fujikata et al. ........ 360/324.11 |
| 6,549,383 | B1 | * | 4/2003 | Gill ........................ 360/324.11 |
| 6,650,512 | B1 | * | 11/2003 | Gill ....................... 360/324.12 |
| 6,661,622 | B1 | * | 12/2003 | Pinarbasi ................. 360/324.1 |
| 6,687,098 | B1 | * | 2/2004 | Huai ..................... 360/324.12 |
| 6,693,775 | B1 | * | 2/2004 | Gill ........................ 360/324.11 |
| 6,788,499 | B1 | * | 9/2004 | Lin et al. ................. 360/324.1 |
| 6,801,415 | B1 | * | 10/2004 | Slaughter et al. ........ 360/324.2 |
| 6,839,206 | B1 | * | 1/2005 | Saito et al. .............. 360/324.2 |
| 6,891,704 | B1 | * | 5/2005 | Pinarbasi ................. 360/324.2 |
| 6,934,130 | B1 | * | 8/2005 | Ikarashi .................. 360/324.1 |
| 2003/0048675 | A1 | * | 3/2003 | Ikeda .......................... 365/200 |
| 2004/0257720 | A1 | * | 12/2004 | Nickel et al. ........... 360/324.11 |

OTHER PUBLICATIONS

Parkin et al., "Oscillations in exchange coupling and magnetoresistance in metallic superlattice structures: Co/Ru, Co/Cr, and Fe/Cr", The American Physical Society, vol. 64, No. 19, pp. 2304-2307 (1990).

Parkin, Spin engineering: Direct determination of the Ruderman-Kittel-Kasuya-Yosida far-field range functions in ruthenium, The American Physical Society, vol. 44, No. 13, pp. 7131-7134 (1991).

* cited by examiner

*Primary Examiner*—Jefferson Evans (57) ABSTRACT

A coupled ferromagnetic structure includes a first ferromagnetic layer, a spacer layer on a first surface of the first ferromagnetic layer, and a second ferromagnetic layer on the spacer layer. Interlayer exchange coupling occurs between the first and second ferromagnetic layers. The coupling may be ferromagnetic or antiferromagnetic. Morphology of the first surface is modified to tailor the interlayer exchange coupling. The structure may form a part of a magnetoresistive device such as a magnetic tunnel junction.

25 Claims, 6 Drawing Sheets

COUPLED FERROMAGNETIC SYSTEMS HAVING MODIFIED INTERFACES

BACKGROUND

Coupled ferromagnetic structures include two ferromagnetic layers separated by a spacer layer. Thickness and composition of the ferromagnetic layers determine the effective properties of the structure. Thickness and composition of the spacer layer determine the type of interlayer exchange coupling that occurs between the two ferromagnetic layers.

Two variations of a coupled ferromagnetic structure are an artificial ferromagnet, and an artificial antiferromagnet. An artificial ferromagnet includes two ferromagnetic layers that are ferromagnetically coupled. That is, magnetic moments of the two ferromagnetic layers point in the same direction across the spacer layer.

An artificial antiferromagnet includes two ferromagnetic layers that are antiferromagnetically coupled across the spacer layer. That is, magnetic moments of one of the ferromagnetic layers point in an opposite direction of magnetic moments of the other ferromagnetic layer. The magnetic moments of the two ferromagnetic layers cancel on a macro scale. Net magnetic moment of the artificial antiferromagnet is determined by the difference in magnetic moments of the two ferromagnetic layers. If the two ferromagnetic layers have equal magnetic moments, the artificial antiferromagnet has zero net magnetization. If the two ferromagnetic layers have unequal magnetic moments, the artificial antiferromagnet has non-zero net magnetization.

The bottom ferromagnetic layer is formed on a seed layer. The seed layer provides proper texture (i.e., crystal orientation) for the bottom ferromagnetic layer. The proper texture provides high exchange coupling.

It would be desirable to form coupled ferromagnetic structures on amorphous materials. However, amorphous materials do not provide the proper texture for the bottom ferromagnetic layer.

SUMMARY

According to one aspect of the present invention, a coupled ferromagnetic structure includes a first ferromagnetic layer, a spacer layer on a first surface of the first ferromagnetic layer, and a second ferromagnetic layer on the spacer layer. Interlayer exchange coupling occurs between the first and second ferromagnetic layers. The coupling is ferromagnetic or antiferromagnetic. Morphology of the first surface is modified to tailor the interlayer exchange coupling.

Other aspects and advantages of the present invention will become apparent from the following detailed description, taken in conjunction with the accompanying drawings, illustrating by way of example the principles of the present invention.

DETAILED DESCRIPTION

Reference is made to FIGS. 1a–1d, which show a coupled ferromagnetic structure 110 including a bottom ferromagnetic layer 120, a spacer layer on the bottom ferromagnetic layer 120, and a top ferromagnetic layer 140 on the spacer layer 130. Top and bottom refer to the order in which the ferromagnetic layers are formed: the bottom layer 120 is formed before the top layer 140.

Exemplary materials for the first and second ferromagnetic layers 120 and 140 include, without limitation, alloys of Co, Fe and Ni. The ferromagnetic layers 120 and 140 may be made amorphous by doping the alloys with materials such as B, Nb, Hf, Zr, Ta, N, Al, Si, and Cr.

The first ferromagnetic layer 120 has a magnetization vector (M1) that can be oriented at either of two stable orientations. The second ferromagnetic layer 140 has a magnetization vector (M2) that can be oriented at either of two stable orientations The spacer layer 130 may be made of an electrically conductive, non-magnetic material such as Ru, Re, Rh, Si or Cu. The thickness of the spacer layer 130 determines the type of interlayer exchange coupling between the ferromagnetic layers 120 and 140. If the interlayer exchange coupling is ferromagnetic, the magnetization vectors (M1 and M2) of the ferromagnetic layers 120 and 140 point in the same direction. That is, the magnetization vectors (M1 and M2) are parallel. If the interlayer exchange coupling is antiferromagnetic, the magnetization vectors (M1 and M2) of the ferromagnetic layers 120 and 140 point in opposite directions. That is, the magnetization vector (M1) of the first ferromagnetic layer 120 is anti-parallel to the magnetization vector (M2) of the second ferromagnetic layer 140.

The bottom ferromagnetic layer 120 and the spacer layer 130 form an interface 125. The interface 125 is modified to increase the interlayer exchange coupling. If the interface morphology can be controlled, roughness of the interface can adjusted to tailor the interlayer exchange coupling.

Figure 1A:
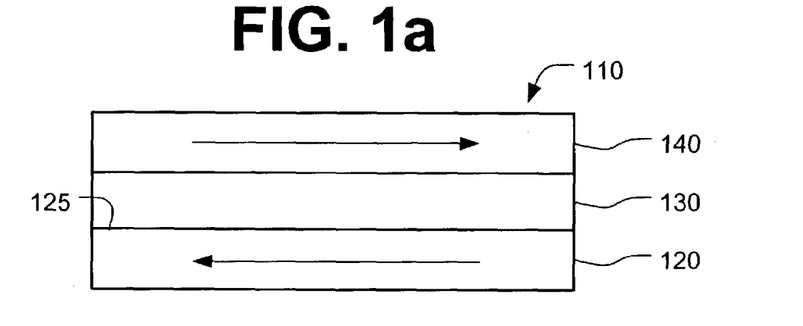
FIGS. 1a–1b are illustrations of a structure according to a first embodiment of the present invention.
Figure 1B:
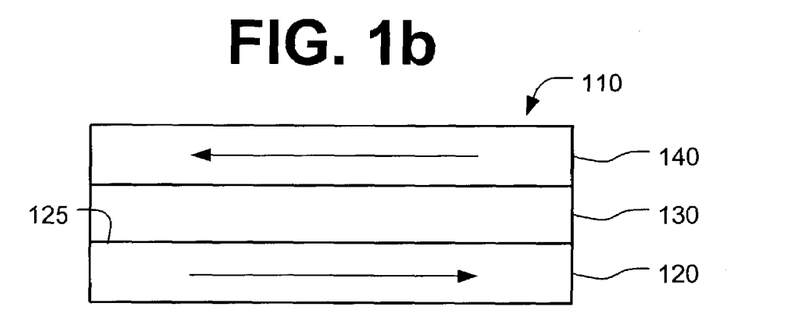

The structure 110 shown in FIGS. 1a–1b is an artificial antiferromagnet, which has ferromagnetic layers 120 and 140 of equal thickness and antiferromagnetic interlayer exchange coupling between the ferromagnetic layers 120 and 140. The magnetization vector (M1) of the first ferromagnetic layer can be switched between a first stable orientation (FIG. 1a) and a second stable orientation (FIG. 1b), and the magnetization vector (M2) of the second ferromagnetic layer 140 points in the opposite direction. Because the magnetization vectors (M1 and M2) of an artificial antiferromagnet point in opposite directions, the magnetic moment of the artificial antiferromagnet is $MM_{AAF} = MM_1 - MM_2$, where $MM_1$ is the magnetic moment of the first ferromagnetic layer 120, $MM_2$ is the magnetic moment of the second ferromagnetic layer 140, and $MM_{AAF}$ is the resultant magnetic moment of the artificial antiferromagnet. Net coercivity of the artificial antiferromagnet can be made substantially lower than the magnitude of the interlayer exchange coupling by designing the ferromagnetic layers 120 and 140 to have about the same magnetic moment.

The magnetic moments $MM_1$ and $MM_2$ may be made different by using different bit shapes, geometry, composition, thickness, etc, for the ferromagnetic layers 120 and 130.

Figure 1C:
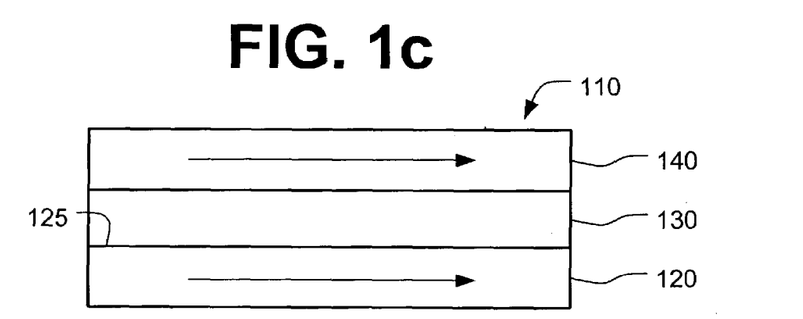
FIGS. 1c–1d are illustrations of a structure according to a second embodiment of the present invention.
Figure 1D:
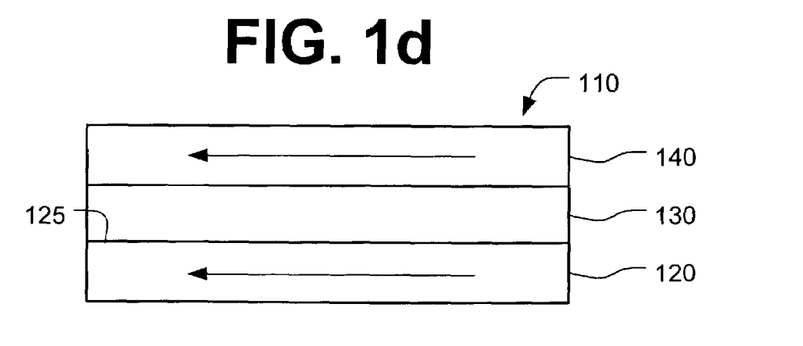

The structure 110 shown in FIGS. 1c–1d is an artificial ferromagnet, which has a spacer layer thickness such that the interlayer exchange coupling between the ferromagnetic layers 120 and 140 is ferromagnetic. The magnetization vector (M1) of the first ferromagnetic layer can be switched between a first stable orientation (FIG. 1c) and a second stable orientation (FIG. 1d), and the magnetization vector (M2) of the second ferromagnetic layer 140 points in the same direction.

The coupled ferromagnetic structures according to the present invention are not limited to two ferromagnetic layers. The structures could have additional ferromagnetic and spacer layers. For example, a coupled ferromagnetic structure according to the present invention could have a bottom ferromagnetic layer, a first spacer layer on the bottom ferromagnetic layer, an intermediate ferromagnetic layer on the first spacer layer, a second spacer layer on the intermediate ferromagnetic layer, and a top ferromagnetic layer on the second spacer layer. The ferromagnetic layers 120 and 140 may have different materials and thickness.

Figure 2:
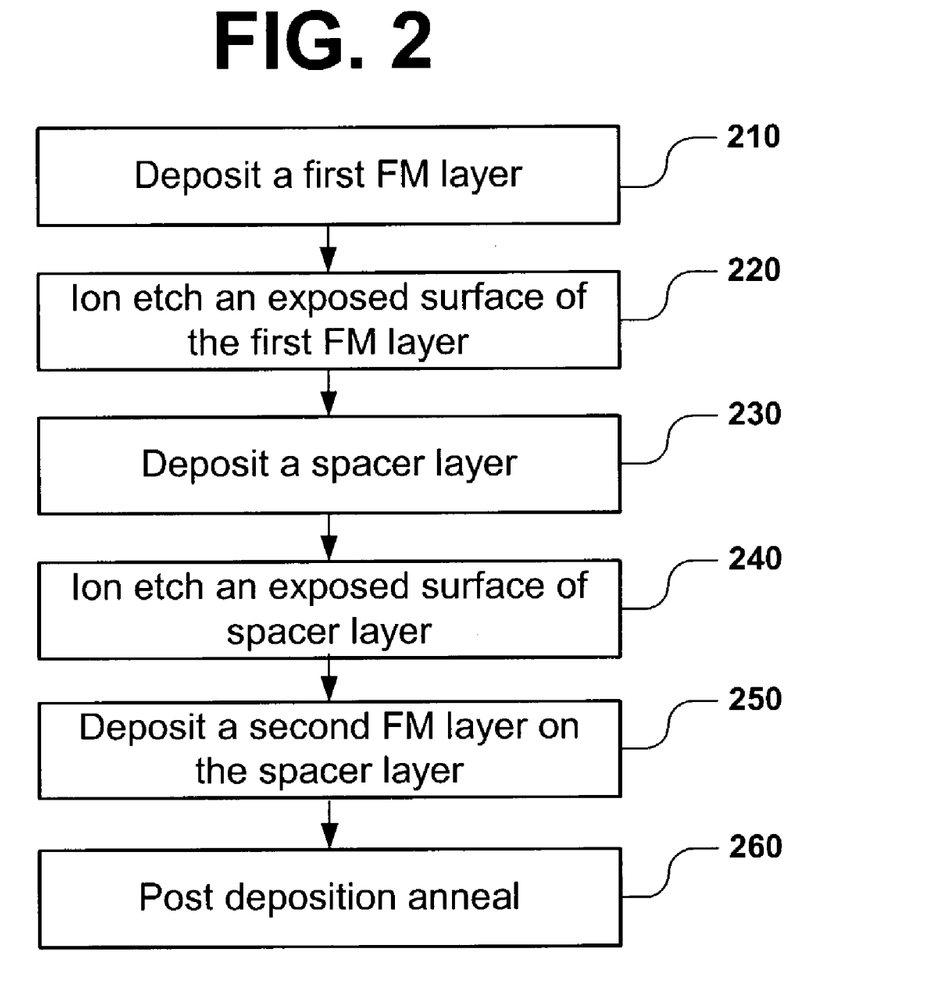
FIG. 2 is an illustration of a method of fabricating a structure according to an embodiment of the present invention

Reference is made to FIG. 2, which illustrates a method of fabricating a coupled ferromagnetic structure 110. A first ferromagnetic layer is deposited on a substrate (210). The first ferromagnetic layer may be deposited by standard thin film deposition techniques such as ion beam deposition, rf sputtering, evaporation, chemical vapor deposition, atomic layer deposition, laser ablation, or plating. The substrate may be a wafer at an intermediate step in another process. An example of this would be the surface of a tunnel barrier in a magnetic tunnel junction materials stack.

The substrate may be crystalline, polycrystalline or amorphous. The substrate affects the roughness, grain size, and texture of the first ferromagnetic layer. A crystalline material such as tantalum provides a good seed layer for the first ferromagnetic layer. The seed layer reduces the roughness of the exposed surface of the first ferromagnetic layer. An amorphous material creates poorer texture and greater roughness than a typical crystalline material.

It has been found that better texture increases the interlayer exchange coupling, and more roughness reduces the interlayer exchange coupling. It has also been found that roughness has a greater effect on the interlayer exchange coupling than texture.

Next, the exposed surface of the first ferromagnetic layer is modified (220). Ion etching may be performed. It is believed that the ion etching reduces the roughness of the exposed surface. An advantage of ion etching is that it allows the surface morphology to be modified and, therefore, the interlayer exchange coupling to be tailored, in a controlled manner. The interlayer exchange coupling can be tailored by adjusting time and energy of the ion etching. In addition, the ion etching can be performed in-situ, so there is no contamination of the surfaces.

The amount of ion etching is device-dependent. It is believed that ion etching reduces interface roughness up to a certain point, but actually increases roughness beyond that point.

A spacer layer is deposited on the first ferromagnetic layer (230). Thickness and composition of the spacer layer determine whether the interlayer exchange coupling will be ferromagnetic or antiferromagnetic. An exposed surface of the spacer layer may also be modified by ion etching (240).

A second ferromagnetic layer is deposited on the spacer layer (250). The magnetization orientation of the coupled ferromagnetic structure may be set during a post deposition anneal in an applied external field (260).

Figure 3:
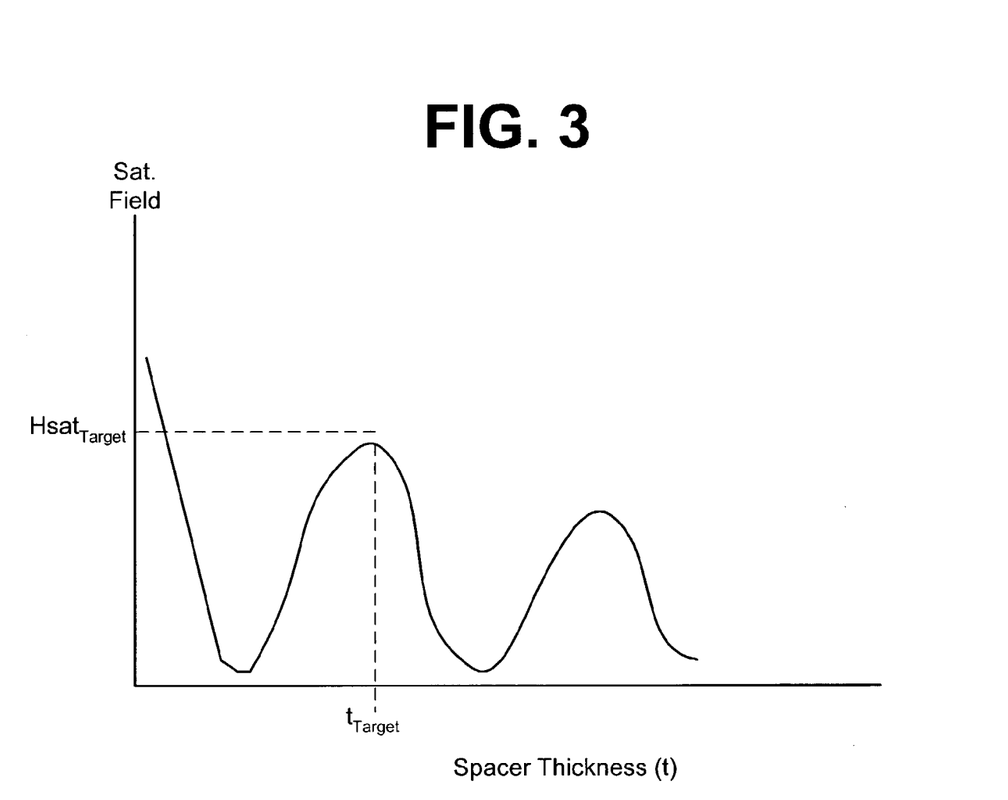
FIG. 3 is an illustration of an interlayer exchange coupling curve for a structure according to an embodiment of the present invention.

Reference is now made to FIG. 3, which illustrates the interlayer exchange coupling between the first and second ferromagnetic layers. The curve represents saturation fields of a coupled ferromagnetic structure for the spacer thickness indicated. When the coupling is antiferromagnetic, the saturation field is greater than zero. When the coupling is ferromagnetic, the saturation field is close to zero. At the target thickness ($T_{target}$), the slope is very steep. As a result, a small change in thickness can cause a drastic change in the saturation field at a region.

It is believed that the interface roughness can effect the saturation field by causing the effective thickness to vary from region to region. The interface roughness causes some regions of FM1 and FM2 to be just a bit closer (whereby the actual saturation field is lower than the target saturation field), and other regions of FM1 and FM2 to be just a bit farther apart (whereby the actual saturation field is higher than the target saturation field). It is believed that the ion etching creates a more uniform effective thickness from region to region.

Figure 4:
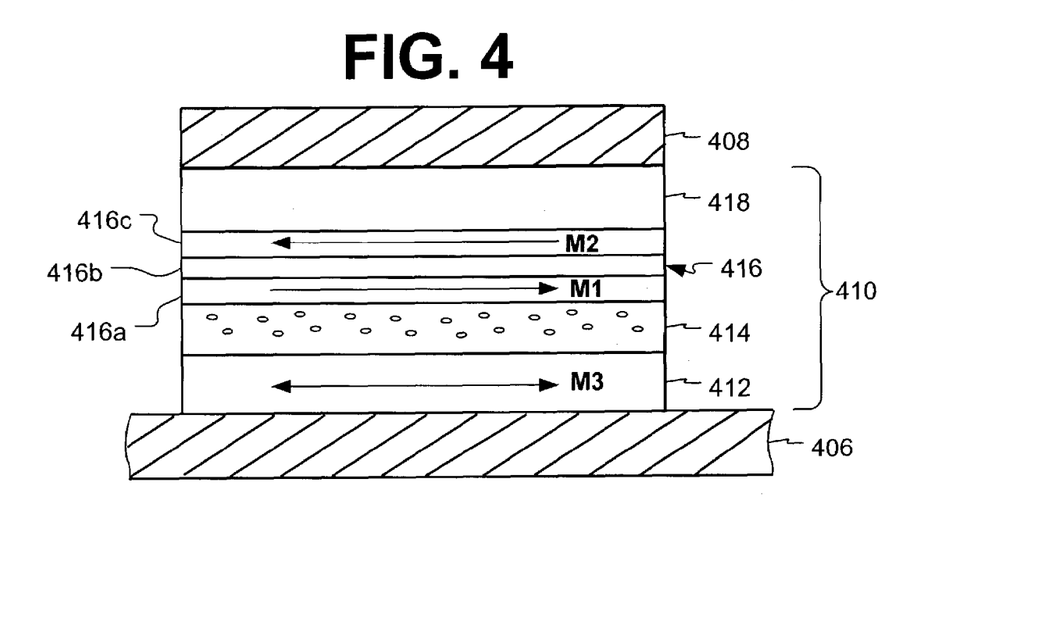
FIGS. 4–6 are illustrations of magnetic tunnel junctions according to different embodiments of the present invention.
Figure 5:
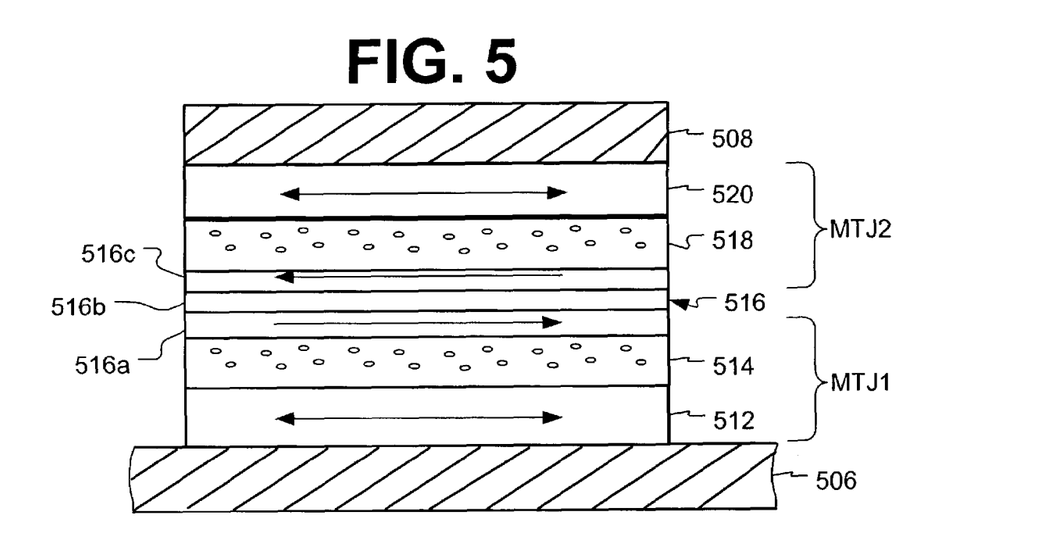
Figure 6:
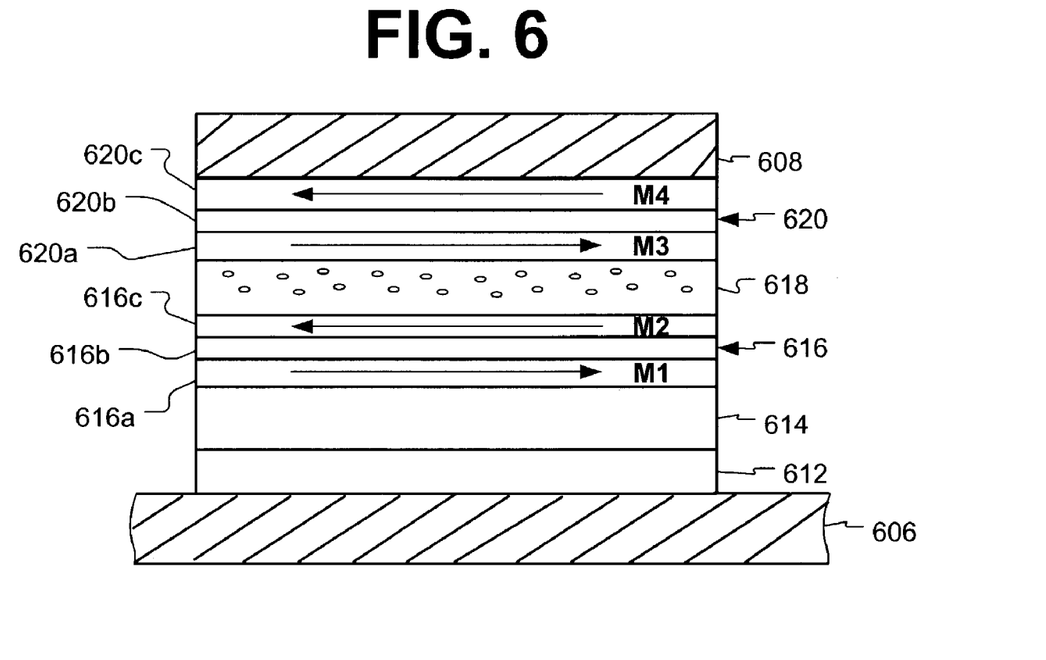

The coupled ferromagnetic structure 110 may be used in a magnetoresistive device such as a magnetic tunnel junction or a giant magnetoresistive (GMR) device. FIGS. 4–6 illustrate different embodiments of magnetic tunnel junctions.

Reference is now made to FIG. 4, which illustrates a top-pinned magnetic tunnel junction 410. The top-pinned magnetic tunnel junction includes a free ferromagnetic layer 412, an insulating tunnel barrier 414 on the free ferromagnetic layer 412, an artificial antiferromagnet 416 on the insulating tunnel barrier 414, and an AF pinning layer 418 on the artificial antiferromagnet 416. The magnetic tunnel junction 410 is considered top-pinned because the artificial antiferromagnet 416 and the AF pinning layer 418 are formed after the free layer 412.

The artificial antiferromagnet 416 includes a first ferromagnetic layer 416a, a spacer layer 416b on the first ferromagnetic layer 416a, and a second ferromagnetic layer 416c on the spacer layer 416b. Magnetization vectors (M1 and M2) of the first and second ferromagnetic layers 416a and 416c are antiferromagnetically coupled. The first ferromagnetic layer 416a is formed on an amorphous material (the insulating tunnel barrier 414) and, consequently, lacks the proper texture. The first ferromagnetic layer 416a and the spacer layer 416b form an interface that has been modified to compensate for the lack of texture from the first ferromagnetic layer 416a.

The AF pinning layer 418 provides an exchange field, which pins the magnetization vector (M2) of the second ferromagnetic layer 416c. Due to the strong interlayer exchange coupling, the magnetization (M1) of the first ferromagnetic layer 416a is also pinned.

The free layer 412 has a magnetization vector (M3) that is allowed to rotate in the presence of an applied magnetic field in a range of interest (the magnetic field may be applied by bottom and top conductors 406 and 408). The free magnetization vector (M3) may be allowed to change between two stable orientations. In one stable orientation, the magnetization vectors (M3 and M1) are pointing in the same direction, whereby the magnetic tunnel junction 410 is said to have a parallel magnetization orientation. In the other stable orientation, the magnetization vectors (M3 and M1)

are pointing in opposite directions, whereby the magnetic tunnel junction 410 is said to have an anti-parallel magnetization orientation.

The insulating tunnel barrier 414 allows quantum mechanical tunneling to occur between the free layer 412 and the artificial antiferromagnet 416. This tunneling phenomenon is electron spin dependent, making the resistance across the device 410 (i.e., the through-plane resistance) a function of the relative orientation of the magnetization vectors (M1 and M3). Generally, the resistance of the magnetic tunnel junction 410 is a first value ($R_N$) when the magnetization vectors (M3 and M1) point in the same direction, and the resistance is increased to a second value ($R_N+\Delta R_N$) when the magnetization vectors (M3 and M1) point in opposite directions. The ratio $\Delta R_N/R_N$ is referred to as the tunneling magnetoresistance ratio (TMR).

A write operation may be performed on the device 410 by applying an external magnetic field to the free layer 412. The external magnetic field causes the magnetization vector (M3) of the free layer 412 to switch to a desired orientation.

A read operation may be performed on the magnetic tunnel junction 410 by applying a voltage across the device 410 and sensing a perpendicular-plane current that flows through the magnetic tunnel junction 410. Magnitude of this sense current is inversely proportional to the resistance of the magnetic tunnel junction 410. Thus the magnitude of the sense current can indicate the logic value stored in the magnetic tunnel junction 410.

An inherent advantage of the top-pinned magnetic tunnel junction 410 is that it has much less Ne'el ferromagnetic coupling (also known as "orange peel" coupling) than a conventional bottom-pinned magnetic tunnel junction. The free layer 412 of the top-pinned magnetic tunnel junction 410 does not suffer from the roughness associated with the strain relaxation of a lattice mismatch between the artificial antiferromagnet 416 and the AF pinning layer 418.

Yet another advantage of the ion etching is that redeposited material on the surface of the pinned layer fills in grain boundaries. As a result, grain boundary diffusion into the pinning layer is blocked, especially if the AF pinning layer 418 contains manganese (e.g., IrMn). Since loss of TMR with thermal annealing is generally believed to be due to the diffusion of manganese from the AF pinning layer 418 to the insulating tunnel barrier 414 through grain boundary diffusion, and since grain boundary diffusion is orders of magnitude greater than intra-grain diffusion, reduction of grain boundary diffusion can significantly improve the thermal stability of the magnetic tunnel junction 410.

During fabrication of the magnetic tunnel junction 410, an upper surface of the artificial antiferromagnet 416 may be smoothed to increase exchange coupling between the artificial antiferromagnet 416 and the AF pinning layer 418. This increase in exchange coupling can increase the tunneling magnetoresistance ratio of the magnetic tunnel junction 410.

Reference is now made to FIG. 5, which illustrates a dual-junction device 510. The dual junction device 510 also includes a free ferromagnetic layer 512, insulating tunnel barrier 514 and artificial antiferromagnet 516. Instead of an AF pinning layer, however, the dual junction device 510 includes a second insulating tunnel barrier 518 on the artificial antiferromagnet 516, and a second free layer 520 on the second insulating tunnel barrier 518. The second free layer 520 also has a magnetization that can be oriented in either of two stable directions.

The first free ferromagnetic layer 512, the first insulating tunnel barrier 514 and the first ferromagnetic layer 516a of the artificial antiferromagnet 516 form a first magnetic tunnel junction (MTJ1). The first ferromagnetic layer 516a provides a reference layer for the first magnetic tunnel junction (MTJ1). The second ferromagnetic layer 520, the second insulating tunnel barrier 518, and the second ferromagnetic layer 516c of the artificial antiferromagnet 516 form a second magnetic tunnel junction (MTJ2). The second ferromagnetic layer 516c provides a reference layer for the second magnetic tunnel junction (MTJ2). Since the spacer layer 516b is made of an electrically conductive material, the first and second magnetic tunnel junctions (MTJ1 and MTJ2) are electrically connected in series.

Read and write operations can be performed on the dual-junction device 510 as described in assignee's U.S. Ser. No. 10/426,381 filed Apr. 29, 2003.

Reference is now made to FIG. 6, which illustrates a bottom-pinned magnetic tunnel junction 610. The bottom-pinned magnetic tunnel junction 610 includes a seed layer 612, an AF pinning layer 614 on the seed layer 612, and a first structure 616 on the AF pinning layer 614. The first structure 616 includes first and second ferromagnetic layers 616a and 616c and a spacer layer 616b therebetween. Interlayer exchange coupling between the ferromagnetic layers 616a and 616c may be antiferromagnetic or ferromagnetic. The seed layer 612 provides proper texture for the AF pinning layer 614, and the AF pinning layer 614 provides an exchange field that pins the magnetization vectors (M1 and M2) of the first structure 616. The first structure 616 functions as a reference layer.

The bottom-pinned magnetic tunnel junction 610 further includes an insulating tunnel barrier 618 on the first structure 616, and a second structure 620 on the insulating tunnel barrier 618. The second structure 620 includes first and second ferromagnetic layers 620a and 620c and a spacer layer 620b therebetween. Interlayer exchange coupling between the ferromagnetic layers 620a and 620c is antiferromagnetic. The ferromagnetic layers 620a and 620c have different magnetic moments so that the magnetization vectors can be rotated when exposed to an applied magnetic field in a range of interest.

The second structure 620 functions to store or sense data. Magnetization vectors (M3 and M4) of the second structure 620 are not pinned and can be set to a first magnetization orientation (shown in FIG. 6) or a second magnetization orientation (not shown). Data can be stored in the bottom-pinned magnetic tunnel junction 610 by setting the magnetization vectors of the ferromagnetic layers 620a and 620c to a desired orientation.

The bottom-pinned magnetic tunnel junction 610 has a parallel magnetization orientation if the magnetization vectors (M2 and M3) of the ferromagnetic layers 616c and 620a point in the same direction, and an anti-parallel magnetization orientation if the magnetization vectors (M2 and M3) of the ferromagnetic layers 616c and 620a point in opposite directions.

A bottom-pinned magnetic tunnel junction 610 is not the only device that can have an artificial antiferromagnet or ferromagnet in place of the free layer. Other types of magnetic tunnel junctions (e.g., the devices 410 and 510 shown in FIGS. 4 and 5) could have an artificial antiferromagnet or ferromagnet in place of a free layer.

A magnetoresistive device according to the present invention is not limited to any particular application. Exemplary applications include magnetic random access memory (MRAM) devices and hard disk drives.

Figure 7:
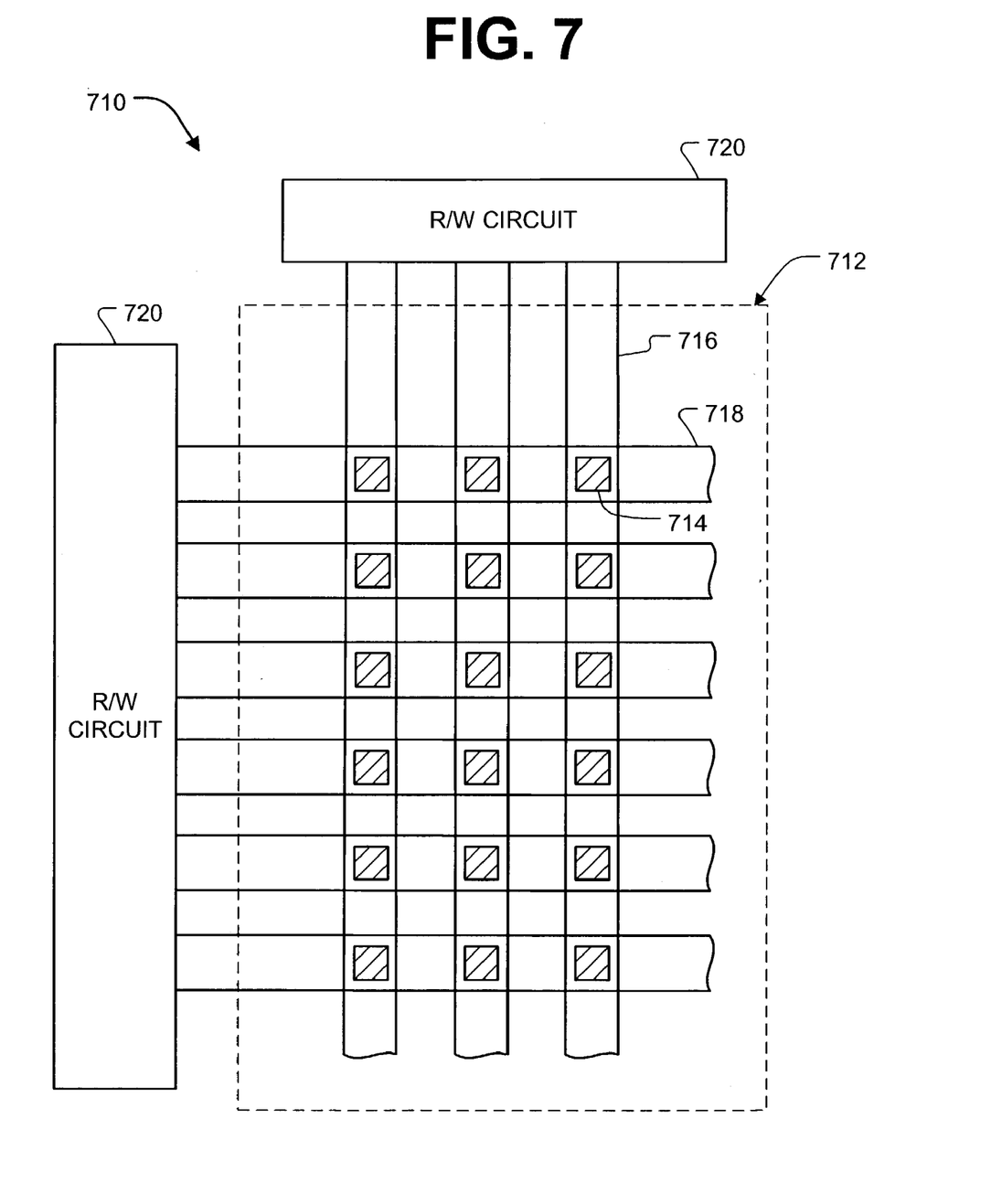
FIG. 7 is an illustration of an MRAM device according to an embodiment of the present invention.

FIG. 7 illustrates an MRAM device 710 including an array 712 of memory cells 714. Each memory cell 714 may include a magnetic tunnel junction according to the present invention. Only a relatively small number of memory cells 714 are shown to simplify the description of the MRAM device 710. In practice, arrays 712 of other sizes may be used.

Word lines 716 extend along rows of the memory cells 714, and bit lines 718 extend along columns of the memory cells 714. There may be one word line 716 for each row of the array 712 and one bit line 718 for each column of the array 712. Each memory cell 714 is located at a cross point of a word line 716 and bit line 718.

The MRAM device 710 also includes a read/write circuit 720 for performing read and write operations on selected memory cells 714. During write operations, the read/write circuit 720 supplies write currents to the word and bit lines 716 and 718 crossing a selected memory cell 714. The write currents create magnetic fields that, when combined, cause the free layer of the selected memory cell 714 to switch to the desired magnetization orientation.

During read operations, the read/write 720 circuit may apply a voltage across the word and bit lines 716 and 718 crossing the memory cell 714, causing a sense current to flow through the magnetic tunnel junction of the selected memory cell 714. The sense current indicates the resistance state and, therefore, stored logic value of the selected memory cell 714.

The present invention is not limited to magnetoresistive devices having two stable orientations or devices having magnetization vectors extending in the same direction. The magnetization vector of the free layer could be orthogonal to the magnetization vectors of the ferromagnet or artificial antiferromagnet. This magnetic tunnel junction has a resistance that varies as the free magnetization vector is rotated from one direction to the other. Its R-H transfer curve has a region that is roughly linear. Roughness of the interface in the reference structure can be modified to change the effective saturation field ($H_{sat}$) of the artificial antiferromagnet. An exemplary application for such a magnetic tunnel junction is a hard disk drive.

Figure 8:
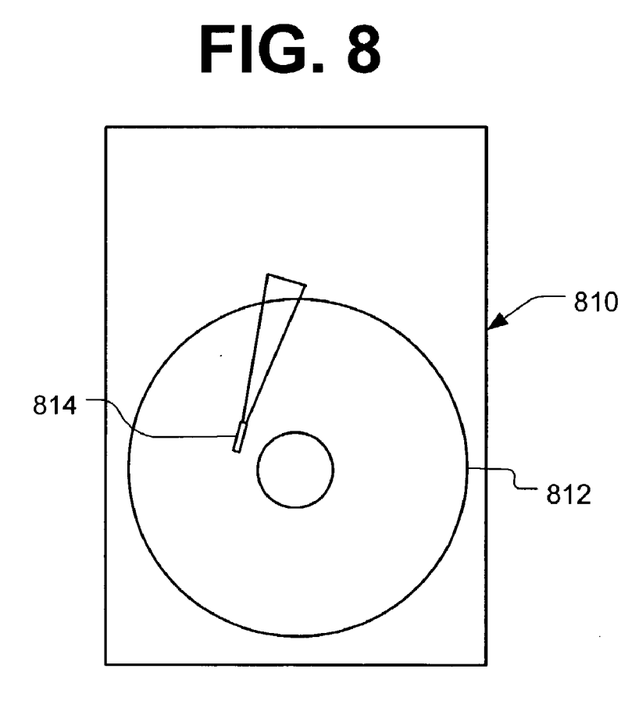
FIG. 8 is an illustration of a hard disk drive according to an embodiment of the present invention.

Reference is now made to FIG. 8, which shows a hard disk drive 810 including magnetic media disks 812. User data is stored in concentric circular tracks on the surface of each disk 812. The disk drive 810 also includes transducers 814 for performing read and write operations on the disks 812. Each transducer 814 includes a magnetoresistive device according to the present invention for the read operations (each transducer 814 may also include a thin film inductive head for the write operations). During read operations, the magnetoresistive device is operated in the linear region of its transfer curve.

A magnetoresistive device according to the present invention is not limited to a magnetic tunnel junction. The present invention also covers GMR devices. A typical GMR device has a free FM layer and pinned FM layer that are separated by a conductive non-magnetic metallic layer instead of an insulating tunnel barrier. Exemplary spacer layer metals include gold, silver and copper. The relative magnetization orientations of the free layer and pinned layer affect in-plane resistance of a GMR device (as opposed to through-plane or perpendicular-plane resistance of a magnetic tunnel junction).

The present invention is not limited to the specific embodiments described and illustrated above. Instead, the present invention is construed according to the claims that follow.

What is claimed is:

1. A coupled ferromagnetic structure comprising:
an amorphous layer;
a first ferromagnetic layer directly on the amorphous layer;
a spacer layer on a first surface of the first ferromagnetic layer; and
a second ferromagnetic layer on the spacer layer, interlayer exchange coupling occurring between the first and second ferromagnetic layers;
morphology of the first surface modified to tailor the interlayer exchange coupling;
the interlayer exchange coupling being one of ferromagnetic and antiferromagnetic.

2. The structure of claim 1, wherein the amorphous layer is an insulating tunnel barrier.

3. A coupled ferromagnetic structure comprising:
a first ferromagnetic layer;
a spacer layer on a first surface of the first ferromagnetic layer; and
a second ferromagnetic layer on the spacer layer, interlayer exchange coupling occurring between the first and second ferromagnetic layers;
wherein the morphology of the first surface is modified to increase the interlayer exchange coupling, the interlayer exchange coupling being one of ferromagnetic and antiferromagnetic.

4. The structure of claim 3, wherein the interlayer exchange coupling is ferromagnetic, whereby the ferromagnetic and spacer layers form an artificial ferromagnet.

5. The structure of claim 3, wherein the interlayer exchange coupling is antiferromagnetic, wherein the ferromagnetic and spacer layers form an artificial antiferromagnet.

6. The structure of claim 3, wherein the morphology of the first surface is modified by modifying roughness of the first surface.

7. A magnetoresistive device including at least one structure of claim 3.

8. The device of claim 7, wherein at least one structure forms a reference layer.

9. The device of claim 7, wherein at least one structure forms a free layer.

10. A magnetic tunnel junction including the structure of claim 3.

11. A memory cell of a data storage device, the memory cell including the magnetic tunnel junction of claim 10.

12. A data storage device including an array of memory cells, each memory cell including at least one magnetic tunnel junction of claim 10.

13. A read head for a hard disk drive, the read head including the magnetic tunnel junction of claim 10.

14. A hard disk drive including at least one read head, each read head including the magnetic tunnel junction of claim 10.

15. The structure of claim 3, wherein the first surface of the first ferromagnetic layer is oxide-free.

16. A magnetoresistive device comprising:
a free ferromagnetic layer;
a first spacer layer on the free ferromagnetic layer, the first spacer layer made of an amorphous material; and
a coupled ferromagnetic structure on the spacer layer, the structure including a first ferromagnetic layer on the first spacer layer; a second spacer layer on the first ferromagnetic layer, and a second ferromagnetic layer on the second spacer layer, interlayer exchange coupling between the first and second ferromagnetic layers being antiferromagnetic, the first ferromagnetic layer and the second spacer layer forming an interface, morphology of the interface having been modified to increase the interlayer exchange coupling.

17. The device of claim 16, wherein the first spacer layer is an insulating tunnel barrier.

18. The device of claim 17, further comprising an AF pinning layer on the coupled ferromagnetic structure; wherein the device is a top-pinned magnetic tunnel junction.

19. The device of claim 17, further comprising a second insulating tunnel barrier on the coupled ferromagnetic structure; and a second free layer on the second barrier; wherein the device is a dual-junction magnetic tunnel junction.

20. A magnetic random access memory device including an array of memory cells, each memory cell including the device of claim 16.

21. A memory cell of a data storage device, the memory cell including the device of claim 16.

22. A hard disk drive including at least one read head, each read head including the device of claim 16.

23. A read head for a hard disk drive, the read head including the device of claim 16.

24. A method of forming a coupled ferromagnetic structure including a first ferromagnetic layer, a spacer layer on a first surface of the first ferromagnetic layer, a second ferromagnetic layer on the spacer layer, one of ferromagnetic and antiferromagnetic coupling occurring between the first and second ferromagnetic layers, the method comprising flattening the first surface by ion etching to tailor the coupling.

25. The method of claim 24, wherein the first surface is flattened in a controlled manner by adjusting time and energy of the ion etching.

* * * * *